US012671442B1

(12) United States Patent
Benkler et al.

(10) Patent No.: US 12,671,442 B1
(45) Date of Patent: Jun. 30, 2026

(54) LOW LATENCY, ERROR RELATIVE, REED-SOLOMON DECODER

(71) Applicant: Cisco Technology, Inc., San Jose, CA (US)

(72) Inventors: Gal Benkler, Tel Aviv (IL); Liron Sheffer, Ein Vered (IL)

(73) Assignee: CISCO TECHNOLOGY, INC., San Jose, CA (US)

( * ) Notice: Subject to any disclaimer, the term of this patent is extended or adjusted under 35 U.S.C. 154(b) by 105 days.

(21) Appl. No.: 18/621,228

(22) Filed: Mar. 29, 2024

Related U.S. Application Data

(60) Provisional application No. 63/494,062, filed on Apr. 4, 2023.

(51) Int. Cl.
| | |
|---|---|
| *H03M 13/15* | (2006.01) |
| *G06F 11/10* | (2006.01) |
| G06F 11/14 | (2026.01) |
| H03M 13/05 | (2006.01) |

(52) U.S. Cl.
CPC ............................... *H03M 13/1515* (2013.01)

(58) Field of Classification Search
CPC .............. H03M 13/03; H03M 13/151; H03M 13/1515; H03M 13/1525; H03M 13/1535; H03M 13/11; H03M 13/15; H03M 13/05; H03M 13/2948; H04L 1/004; H04L 1/0041; H04L 1/005; H04L 1/0051; G06F 11/10; G06F 11/14; G06F 11/1008
USPC ................ 714/784, 751, 752, 795, 809, 760
See application file for complete search history.

(56) References Cited

U.S. PATENT DOCUMENTS

| | | | | |
|---|---|---|---|---|
| 6,675,340 | B1 * | 1/2004 | Hardie ................... | H04L 65/80 |
| | | | | 714/751 |
| 7,757,156 | B2 * | 7/2010 | Jung ................. | H03M 13/1535 |
| | | | | 714/784 |
| 7,900,122 | B2 | 3/2011 | Shen et al. | |
| 9,923,580 | B2 * | 3/2018 | Lee ................... | H03M 13/3715 |
| 10,312,937 | B2 * | 6/2019 | Loncke ............... | H03M 13/114 |
| 2003/0126543 | A1 * | 7/2003 | Lee ................... | H03M 13/1535 |
| | | | | 714/784 |

(Continued)

FOREIGN PATENT DOCUMENTS

| | | | | |
|---|---|---|---|---|
| EP | 1841074 B1 | 12/2008 | | |
| WO | WO-2022188173 A1 * | 9/2022 | ............ | H03M 13/15 |

*Primary Examiner* — Albert Decady
*Assistant Examiner* — Grace V Braden
(74) *Attorney, Agent, or Firm* — Edell, Shapiro & Finnan, LLC

(57) ABSTRACT

The device includes an interface configured to enable network communications, a memory, and one or more processors coupled to the interface and the memory, and configured to: receive a message, process the message using forward error correction, in response to a predetermined condition, bypass at least some iterative calculations that are performed by the forward error correction, and output a processed message. The predetermined condition may be that all coefficients of a syndrome representative of the message are zero or that degree of a value in the iterative calculations is lower than a maximum number of errors correctable by the forward error correction. A latency resulting from the processing of the message using the forward error correction is proportional to a number of errors in the message.

20 Claims, 4 Drawing Sheets

(56)     References Cited

U.S. PATENT DOCUMENTS

| | | | |
|---|---|---|---|
| 2008/0148133 A1* | 6/2008 | Duggan | H03M 13/3753 |
| | | | 714/796 |
| 2009/0282320 A1* | 11/2009 | Liao | H03M 13/1525 |
| | | | 714/752 |
| 2011/0107188 A1* | 5/2011 | Dror | H03M 13/152 |
| | | | 714/752 |
| 2018/0060160 A1* | 3/2018 | Fang | H03M 13/1525 |
| 2022/0013187 A1* | 1/2022 | Santhanam | H03M 13/1545 |
| 2023/0396271 A1* | 12/2023 | Gad | H03M 13/1128 |
| 2024/0137150 A1* | 4/2024 | Rahmati | H03M 13/2951 |
| 2024/0204802 A1* | 6/2024 | Graumann | H03M 13/3738 |

* cited by examiner

RECEIVE A MESSAGE — 310

PROCESS THE MESSAGE USING FORWARD ERROR CORRECTION — 312

IN RESPONSE TO A PREDETERMINED CONDITION, BYPASS AT LEAST SOME ITERATIVE CALCULATIONS THAT ARE PERFORMED BY THE FORWARD ERROR CORRECTION — 314

OUTPUT A PROCESSED MESSAGE — 316

LOW LATENCY, ERROR RELATIVE, REED-SOLOMON DECODER

This application claims priority to U.S. Provisional Patent Application No. 63/494,062, filed Apr. 4, 2023, the contents of which is incorporated herein by reference in its entirety.

TECHNICAL FIELD

The present disclosure relates to efficiency enhancements for a Reed-Solomon decoder.

BACKGROUND

Communication over the Internet, and particularly the world wide web, is constantly growing, and with it so is the demand for ever faster and reliable connections. One component that imposes a constant delay on traffic passing through certain endpoints of a data communication network, such as one based on Ethernet or InfiniBand, is the Reed-Solomon Forward Error Correction (RS-FEC) decoder. The RS-FEC decoder is configured to correct bit errors that occur in high bandwidth (e.g., 100G, 200G, 400G, and 800G) links that use, e.g., PAM4 modulation and/or NRZ modulation.

DETAILED DESCRIPTION

Overview

In one embodiment, a device is provided. The device includes an interface configured to enable network communications, a memory, and one or more processors coupled to the interface and the memory, and configured to: receive a message, process the message using forward error correction, in response to a predetermined condition, bypass at least some iterative calculations that are performed by the forward error correction, and output a processed message. The predetermined condition may be that all coefficients of a syndrome representative of the message are zero or that a degree of a value resulting from the iterative calculations is lower than a maximum number of errors correctable by the forward error correction. A latency resulting from the processing of the message using the forward error correction may be proportional to the number, e.g., the total number, of errors in the message.

In another embodiment, a method to operate forward error correction (FEC) is presented. The method may include receiving a message, processing the message using forward error correction, in response to a predetermined condition, bypassing at least some iterative calculations that are performed by the forward error correction, and outputting a processed message. The predetermined condition may be that all coefficients of a polynomial syndrome representative of the message are zero or that a degree of a value resulting from the iterative calculations is lower than a maximum number of errors correctable by the forward error correction.

EXAMPLE EMBODIMENTS

Figure 1:
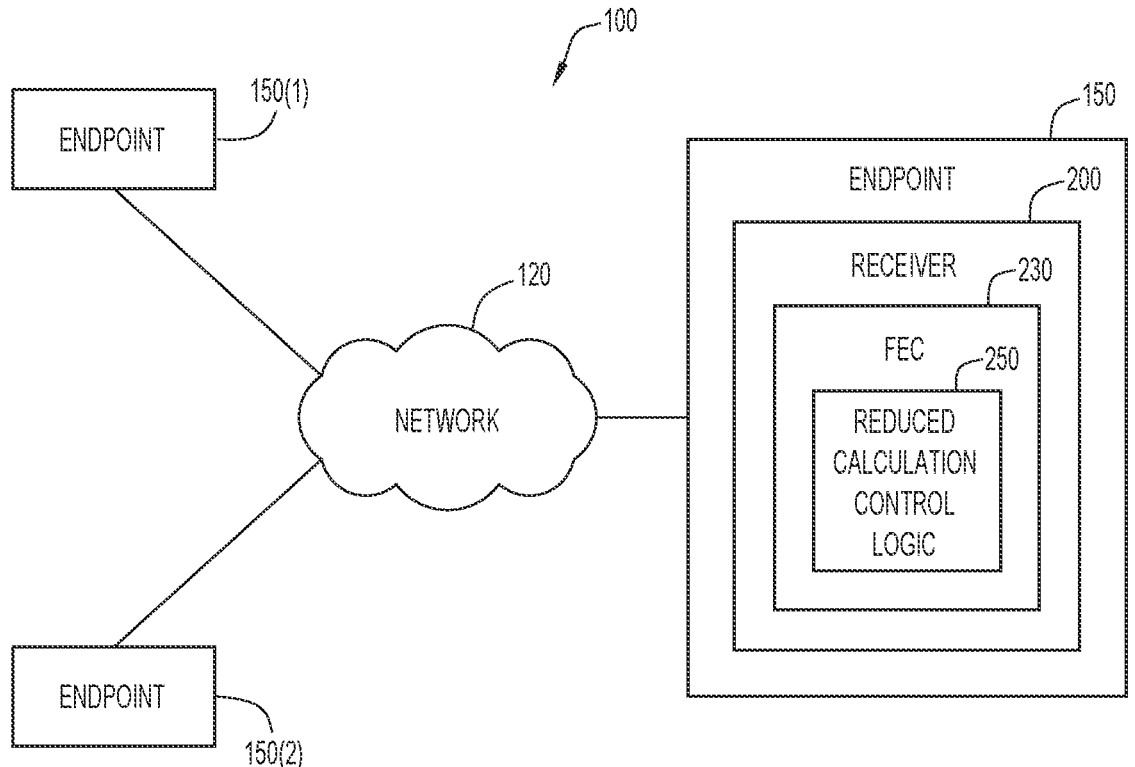
FIG. 1 shows a network having a plurality of endpoints that may be in communication with one another via a network, and where reduced calculation FEC decoder logic is hosted by at least one receiver of at least one of the endpoints, according to an example embodiment.

FIG. 1 shows a network 100 having a plurality of endpoints designated, e.g., as endpoint 150, endpoint 150(1), and endpoint 150(2) that may be in communication with one another via network 120, and where reduced calculation control logic 250 may be hosted by at least one receiver 200 of at least one of the endpoints, namely endpoint 150, according to an example embodiment. More specifically, and taking endpoint 150 as a representative example, receiver 200 may be an optical or electrical receiver with Forward Error Correction (FEC) 230 deployed therein. For example, receiver 200 may be part of an Ethernet Media Access Control (MAC) layer operating according to the IEEE 802.3 standard. As will be explained in more detail in connection with, e.g., FIG. 2, FEC 230 may be implemented as a Reed-Solomon FEC, or RS-FEC, along with reduced calculation control logic 250. In accordance with an embodiment, and as explained in detail below, FEC 230 is enhanced with reduced calculation control logic 250 to operate in a more efficient manner by detecting whether a particular predetermined condition has occurred in connection with processing a given block of bits or message and, if so, prematurely terminating selected remaining compute operations for that given block of bits or message.

An RS-FEC decoder is a systematic block code decoder that protects a constant number of bits (i.e., a message or part of a message) by adding redundant information to a block of bits. The added redundant information is referred to as "parity." In operation, and in one possible embodiment, the RS-FEC decoder operates by first calculating a block syndrome polynomial using an entire received block, including the parity information. The next step takes the syndrome polynomial and resolves an error location polynomial and a magnitude polynomial from which the locations and values of the errors can be extracted.

Calculating the location and magnitude polynomials is a significant function of the decoder and involves a massive calculation, which is performed in what is often referred to as a "key equation solver." The massive calculation consumes power and adds latency regardless of the number of errors in the block and is designed to match the FEC block throughput even when encountering the maximal number of errors that can be corrected.

Interestingly, a probability distribution of the number of errors in FEC blocks shows that the vast majority of the blocks have no errors at all, or perhaps only a single error. Moreover, the probability for more errors in a FEC block drops exponentially with the number of errors.

These findings lead to the conclusion that, for much of the time, the massive calculation performed by the key equation solver in an FEC decoder is of limited value. The methodology described herein exploits these findings and operates to reduce such computing activities. Beneficially, shortening the instances of the calculation can lead to significant improvements in power and in average latency.

In this regard, and as will be explained in detail below, the embodiments described herein take advantage of a given link's characteristics and introduce an FEC decoder whose latency and power consumption are proportional to, or dependent on, the number of errors. Consequently, most of the time, data throughput experiences minimal latency and power is saved.

It is noted that while many Reed-Solomon decoders implementations exist, most are based on an algorithm called "Berlekamp-Massey." One issue with Berlekamp-Massey, and similar methods, is that they take a long time to correct each message, regardless of the number of errors in the message.

More specifically, the latency of implementations of such algorithms is on the order of 3*(Maximum number of errors)+1 clock cycles and, in theory, it may be possible to have an implementation that has a latency on the order of 2*(Maximum number of errors)+1 clock cycles. Taking RS-FEC (544,514) code as an example, the maximal number of correctable errors is 15. Accordingly, the latency is 46 clock cycles or 31 clock cycles, for the normal and fastest theoretical implementations, respectively.

Notably, approaches like Berlekamp-Massey take the same amount of time to fix one error as they do to fix many errors. This effectively means that such approaches treat each message as if it were a worst-case scenario.

Unlike other approaches, including those that employ "Euclid's algorithm" in the key equation solver, the embodiments described herein provide an approach in which the degree of latency is relative to the number of errors that need to be fixed.

The embodiments may be based on two independent mechanisms:

First, the massive calculation is bypassed or prematurely terminated when all coefficients of a syndrome polynomial are 0. That is, when all coefficients of the syndrome are 0, it means that there are no errors in the FEC block, and thus performing the massive calculation provides no benefit.

Second, the iterative loop of calculations (e.g., in some cases polynomial division, or other iterative calculations on, e.g., variables, coefficients, arrays, symbols, or strings of bits) is stopped or prematurely terminated when reaching the point in which the degree of, e.g., a residue polynomial (or other selected polynomial or value) is lower than a maximum number of errors. This iterative process or calculation may be used to calculate the polynomials that represent the location of the errors and their value. Once the error magnitude polynomial's degree is lower than the maximum possible number of errors it means that no more errors will be found for this FEC block.

The first mechanism is effective when there are no errors, while the second mechanism is effective whenever the number of actual errors is smaller than the maximal number of errors.

In other words, predetermined conditions for bypassing or prematurely ending or terminating iterative calculations in the key equation solver may include that (1) all coefficients of the syndrome polynomial are zero or (2) the degree (order or rank) of a polynomial resulting from the iterative process or calculations is lower than a maximum number of errors.

A more rigorous explanation of the approach disclosed herein is provided below.

Error correction operates by sending a relatively large message along with a relatively small number of parity bits, which makes it possible to correct many errors that may have been added to the message along the communications pathway.

The Reed-Solomon method may be outlined in four steps as follows:

STEP 1: Read the message as if it were a polynomial. This means splitting the message into pieces of, e.g., 10 bits, called symbols, and considering each piece as a coefficient of a polynomial: $M(x) = \text{First10Bits} \cdot x^{MessageSize-1} + \text{Second10Bits} \cdot x^{MessageSize-2} + \ldots$ STEP 2: Concatenate the parity. Parity is chosen such that the entire message $T(x)$ has exactly $2t$ known roots. As such, if the roots are denoted as $\alpha_1, \alpha_2, \ldots, \alpha_{2t}$, then $T(\alpha_i) = 0$. It is noted that $t$ is equal to the maximum number of errors that can be corrected.

STEP 3: A message is sent, and errors are (typically inadvertently, but not unexpectedly) added to it during transmission. The errors are considered as polynomial $$E(x) = \sum_{i=0}^{t-1} E_i \cdot x^{e_i} = \sum_{i=0}^{t-1} \text{errMagnitude}_i \cdot x^{errLocation_i}.$$

STEP 4: Decode. A message $R(x) = T(x) + E(x)$ is received and an operation is performed to recreate $T(x) = R(x) - E(x)$. For that, all that is needed to find is $E(x)$. By plugging in the roots $$R(\alpha_i) = T(\alpha_i) + E(\alpha_i) = E(\alpha_i) = \sum_{j=0}^{t-1} E_j \cdot \alpha_i^{e_j} 2t$$

Key Equations are obtained with $2t$ missing variables which can be solved to find $E(x)$.

Decoding may be explained as follows. Note that $t = \text{parity\_size}/2 = \text{maximum number of correctable errors}$, and $v = \text{number of actual errors}$. The key equation solver assumes $v \le t$.

$T(x)$—A polynomial representing the original message sent and the parity.

$$E(x) = \sum_{i=0}^{v-1} E_i \cdot x^{e_i} = \sum_{i=0}^{v-1} \text{errror} \cdot \text{magnitude}_i \cdot x^{error \cdot location_i} - \text{Errors}$$

Errors added to the message.

$R(x) = T(x) + E(x)$—The message received.

Note: $T(x)$ has $2t$ roots denoted by $\alpha^0, \alpha^1, \ldots, \alpha^{2t-1}$ meaning $\forall i \in \{0, 1, \ldots, 2t-1\}$ $$R(\alpha^i) = T(\alpha^i) + E(\alpha^i) = E(\alpha^i)$$

$S(x) = S_0 + S_1 x + \ldots + S_{2t-1} x^{2t-1}$—The syndrome polynomial: $S_i = R(\alpha^i) = E(\alpha^i)$.

The key equation solver uses the syndrome polynomial to solve these $2t$ equations by finding:

$$\Lambda(x) = \prod_{i=0}^{v-1} (1 + \alpha^{e_i} x) - \text{Error}$$

Error location polynomial, whose roots are $\alpha^{-e_i} = \alpha^{-err.loc_i}$.

$$\Omega(x) = [S(x) \cdot \Lambda(x)] \bmod x^{2t} = \sum_{i=0}^{v-1} \Omega_i x^i - \text{Error}$$

Error magnitude polynomial:

$$\Omega_i = \sum\nolimits_{j=0}^{i} S_j \Lambda_{i-j}.$$

Note: $\Omega(x)$ is important because it helps to find the coefficients of $$E(x) = \sum\nolimits_{i=0}^{v-1} E_i \cdot x^{e_i} : E_i = \alpha^{e_i} \cdot \Omega(\alpha^{-e})/\Lambda'(\alpha^{-e})$$

Solving the key equation—Euclid's method

The goal here is to use the calculated syndrome polynomial S(x) to find the error location $\Lambda$(x) and error magnitude $\Omega$(x) polynomials. Euclid's method may be used.

Specifically, by definition, $\Omega(x)=[S(x)\cdot\Lambda(x)]\mod x^{2t}$. This means that there exists a polynomial F(x) such that $S(x)\cdot\Lambda(x)=F(x)\cdot x^{2t}+\Omega(x)$.

Euclid's theory shows that the following algorithm holds:

Initialize: $r_0=x^{2t}, r_1=S(x), \lambda_0=0, \lambda_1=1, f_0=1, f_1=0$ for($i=1$;degree($r_i$)≥$t$;$i=i+1$)

$q$=quotient($r_{i-1}/r_i$)

$r_{i+1}=r_{i-1}-qr_i$#This means that $r_{i+1}$=remainder($r_{i-1}/r_i$).

$\lambda_{i+1}=\lambda_{i-1}-q\lambda_i$ $f_{i+1}=f_{i-1}-qf_i$ $\Omega(x)=r_i$ $\Lambda(x)=\lambda_i$ $F(x)=f_i$ The degree of $r_i$ gets smaller with each iteration, meaning the algorithm runs no more than t iterations. Moreover, when there are v<t errors, the degree will get smaller by more than 1 in some iterations resulting in the algorithm taking approximately v instead of t iterations.

Hence, the fewer errors there are, the less time it takes to finish this calculation.

It is noted that no solution implements the Euclid method directly. This is because large polynomial division cannot be implemented in a single clock cycle and would require a very large area. Due to this, no known implementation can take advantage of the reduced number of iterations that the theoretical solution offers. Instead, the division is avoided with many simpler and repetitive operations, losing the significant advantage that the mathematical method offers.

The embodiments disclosed herein leverage the theoretical mathematical principles, but recognize when the practical existing implementations reach this "early finish" state and then extract the correct solution at this point.

Figure 2:
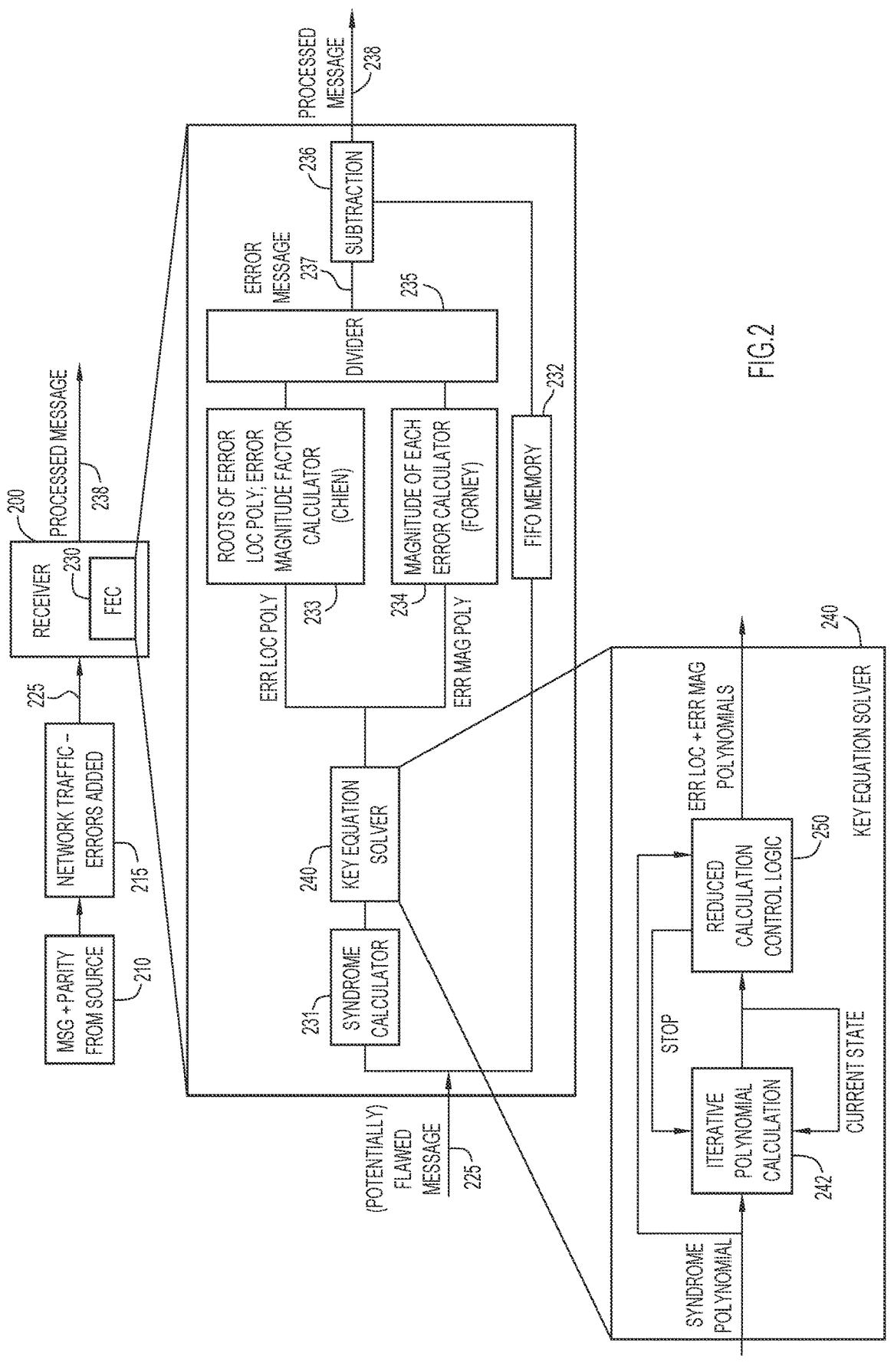
FIG. 2 shows a path of a message and its treatment through a Reed-Solomon FEC decoder including the reduced calculation FEC decoder logic, according to an example embodiment.

Reference is now made to FIG. 2, which shows a path of a message and its treatment through receiver 200 including a Reed-Solomon FEC decoder including reduced calculation control logic 250, according to an example embodiment. As shown at block 210, a message and parity are sent from a source. At block 215, the message travels through a network (e.g., network 120) with the risk of errors being added to bits in the message to create a flawed message 225. Flawed message 225 reaches, e.g., a router, such as endpoint 150 (FIG. 1). Within endpoint 150 is receiver 200 with FEC 230, which generates a corrected or processed message 238, which may then be supplied, e.g., to an internal router for packet handling, etc.

As further shown, FEC 230 receives a (potentially) flawed message 225, which is supplied to Syndrome calculator 231, which applies a manipulation to the received message to create 2*t key equations represented by the Syndrome polynomial. The (potentially) flawed message 225 is also supplied to a first in-first out (FIFO) memory 232 so that the original (potentially) flawed message 225 is available for later processing for error correction. An output of Syndrome calculator 231 is provided to key equation solver 240, which uses an algorithm, e.g., the modified version of the Euclid method discussed above, to find the error location and error magnitude polynomials from the Syndrome polynomial. The Error location polynomial is supplied to block 233, which finds the roots of the error location polynomial and calculates an error magnitude factor according to, e.g., the method disclosed by Chien. At the same time, the error magnitude polynomial is supplied to block 234, which uses the error magnitude polynomial to calculate the magnitude of each error according to, e.g., the method disclosed by Forney. Block 235 divides the error magnitudes by their factor, and outputs an error message 237, which is subtracted, in block 236, from flawed message 225 that is supplied by FIFO memory 232. The corrected or processed message 238 is thus output and supplied to, e.g., a downstream element for, e.g., packet handling. In the event no errors are in the message 225, the message 225 stored in FIFO memory 232 may be output without performing subtraction in block 236.

Key equation solver 240 comprises block 242 and reduced calculation control logic 250. A syndrome polynomial generated by Syndrome calculator 231 is supplied to block 242, which iteratively performs part of the polynomial calculation (e.g., Euclid's method) (or other iterative calculation) at each clock cycle. An output of block 242 is supplied to reduced calculation control logic 250, which recognizes when no more iterations are required, and accordingly generates a stop or terminate command to block 242 and performs modifications to extract the correct solution from the current state. The current state is fed back to block 242 for successive iterative (polynomial) calculations.

As noted previously, two different mechanisms may be implemented by reduced calculation control logic 250 to "short circuit" a full number of (polynomial) calculation iterations by block 242.

The first mechanism operates to altogether bypass operations of the massive calculation when all coefficients of the syndrome polynomial are 0. When all coefficients of the syndrome polynomial are 0, it means that there are no errors in the FEC block being processed. In this regard, reduced calculation control logic 250 may monitor the inputted syndrome polynomial directly, as shown in the figure, and then operate to output the message 225 stored in FIFO memory 232.

The second mechanism operates to prematurely stop or terminate operation of the iterative loop of polynomial division (or other iterative calculation) that is implemented by block 242, when reaching the point in which the degree of the residue polynomial (or other polynomial or value) is lower than the maximum number of errors. This division process is used to calculate the polynomials that represent the location of the errors and their value. Once the residue's (or other value's) degree is lower than the maximum possible number of errors it means that no more errors will be found for the FEC block being processed. Reduced calculation control logic 250 monitors for this condition and sends an appropriate stop or terminate command to block 242, as appropriate.

Error correction in messages passing across, e.g., the Internet, is a vital part of any network device. This process consumes power, takes a long time to complete, and creates a constant delay in data transfer. The methodology described herein, by eliminating certain iterative calculations (e.g., polynomial division), may reduce average calculation efforts on the order of 90%, significantly reducing power consumption and latency of any network device that deploys the methodology.

Figure 3:
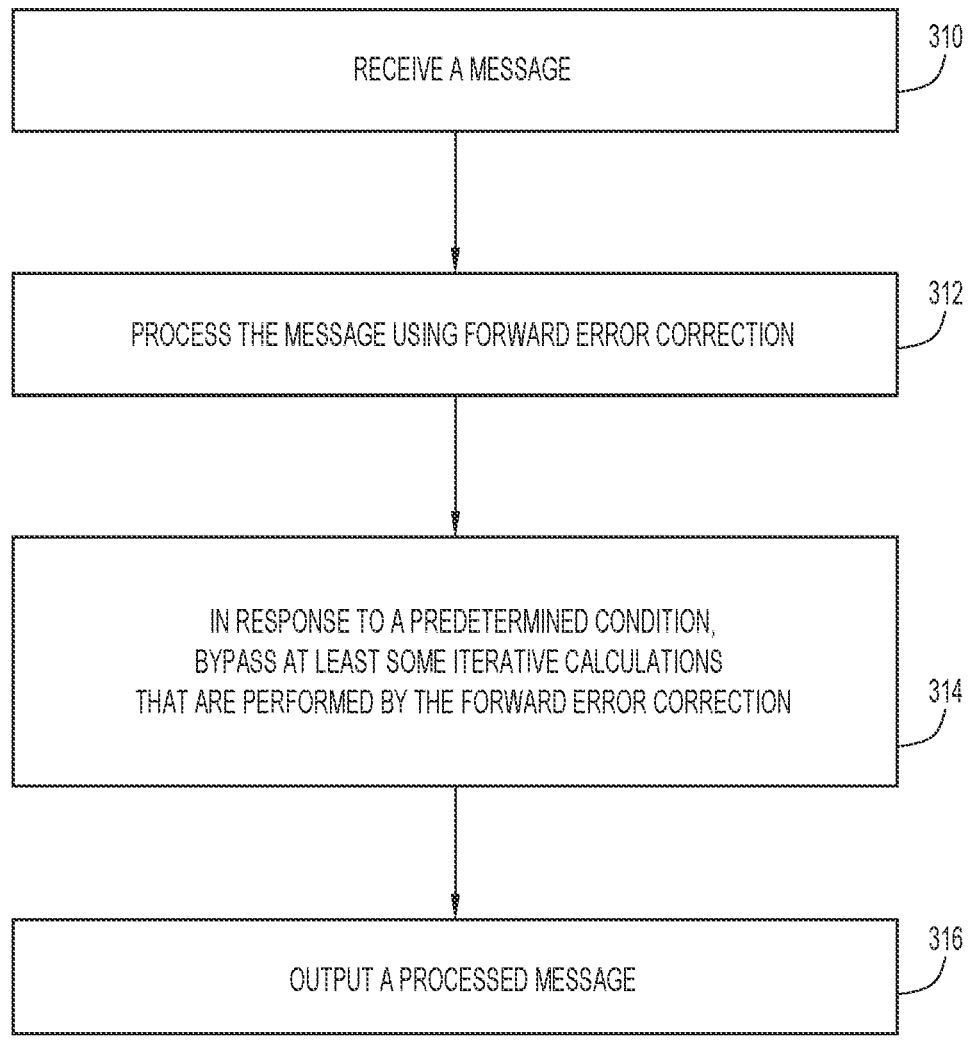
FIG. 3 shows a series of operations for executing forward error correction with reduced calculation FEC decoder logic, according to an example embodiment.

FIG. 3 shows a series of operations for executing forward error correction with reduced calculation control logic 250, according to an example embodiment. At 310, an operation is configured to receive a message. At 312, an operation is configured to process the message using forward error correction. At 314, an operation is configured to, in response to a predetermined condition, bypass at least some iterative calculations that are performed by the forward error correction. And, at 316, an operation is configured to output a processed message.

Figure 4:
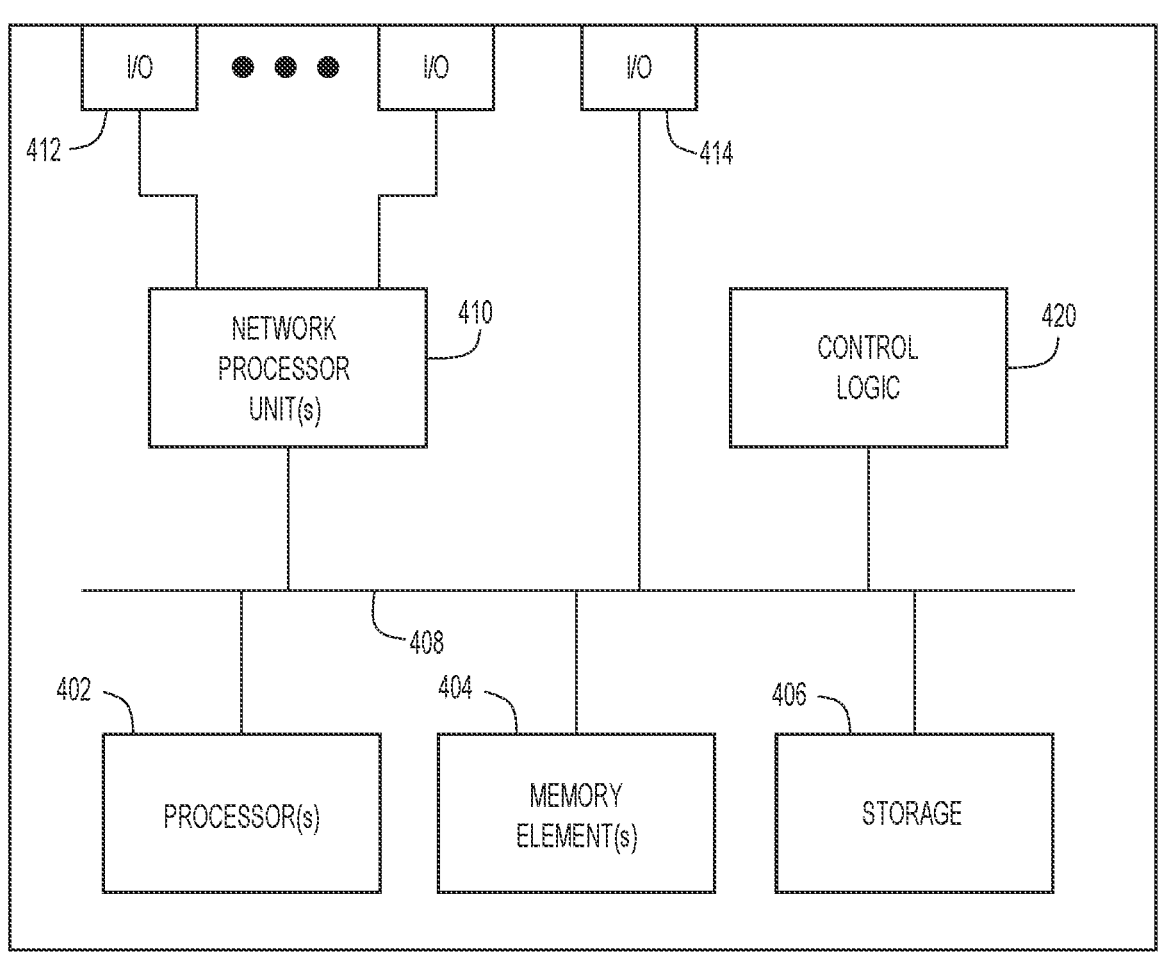
FIG. 4 is a block diagram of a computing device that may be configured to execute reduced calculation FEC decoder logic, and perform the techniques described herein, according to an example embodiment.

FIG. 4 is a block diagram of a computing device that may be configured to execute forward error correction with reduced calculation control logic 250, and perform the techniques described herein, according to an example embodiment. In various embodiments, a computing device, such as computing device 400 or any combination of computing devices 400, may be configured as any entity/entities as discussed for the techniques depicted in connection with FIGS. 1-3 in order to perform operations of the various techniques discussed herein.

In at least one embodiment, the computing device 400 may include one or more processor(s) 402, one or more memory element(s) 404, storage 406, a bus 408, one or more network processor unit(s) 410 interconnected with one or more network input/output (I/O) interface(s) 412, one or more I/O interface(s) 414, and control logic 420 (which could include, for example, reduced calculation control logic 250. In various embodiments, instructions associated with logic for computing device 400 can overlap in any manner and are not limited to the specific allocation of instructions and/or operations described herein.

In at least one embodiment, processor(s) 402 is/are at least one hardware processor configured to execute various tasks, operations and/or functions for computing device 400 as described herein according to software and/or instructions configured for computing device 400. Processor(s) 402 (e.g., a hardware processor) can execute any type of instructions associated with data to achieve the operations detailed herein. In one example, processor(s) 402 can transform an element or an article (e.g., data, information) from one state or thing to another state or thing. Any of potential processing elements, microprocessors, digital signal processor, baseband signal processor, modem, PHY, controllers, systems, managers, logic, and/or machines described herein can be construed as being encompassed within the broad term 'processor'.

In at least one embodiment, memory element(s) 404 and/or storage 406 is/are configured to store data, information, software, and/or instructions associated with computing device 400, and/or logic configured for memory element(s) 404 and/or storage 406. For example, any logic described herein (e.g., control logic 420) can, in various embodiments, be stored for computing device 400 using any combination of memory element(s) 404 and/or storage 406. Note that in some embodiments, storage 406 can be consolidated with memory element(s) 404 (or vice versa) or can overlap/exist in any other suitable manner.

In at least one embodiment, bus 408 can be configured as an interface that enables one or more elements of computing device 400 to communicate in order to exchange information and/or data. Bus 408 can be implemented with any architecture designed for passing control, data and/or information between processors, memory elements/storage, peripheral devices, and/or any other hardware and/or software components that may be configured for computing device 400. In at least one embodiment, bus 408 may be implemented as a fast kernel-hosted interconnect, potentially using shared memory between processes (e.g., logic), which can enable efficient communication paths between the processes.

In various embodiments, network processor unit(s) 410 may enable communication between computing device 400 and other systems, entities, etc., via network I/O interface(s) 412 (wired and/or wireless) to facilitate operations discussed for various embodiments described herein. In various embodiments, network processor unit(s) 410 can be configured as a combination of hardware and/or software, such as one or more Ethernet driver(s) and/or controller(s) or interface cards, Fibre Channel (e.g., optical) driver(s) and/or controller(s), wireless receivers/transmitters/transceivers, baseband processor(s)/modem(s), and/or other similar network interface driver(s) and/or controller(s) now known or hereafter developed to enable communications between computing device 400 and other systems, entities, etc. to facilitate operations for various embodiments described herein. In various embodiments, network I/O interface(s) 412 can be configured as one or more Ethernet port(s), Fibre Channel ports, any other I/O port(s), and/or antenna(s)/antenna array(s) now known or hereafter developed. Thus, the network processor unit(s) 410 and/or network I/O interface(s) 412 may include suitable interfaces for receiving, transmitting, and/or otherwise communicating data and/or information in a network environment.

I/O interface(s) 414 allow for input and output of data and/or information with other entities that may be connected to computing device 400. For example, I/O interface(s) 414 may provide a connection to external devices such as a keyboard, keypad, a touch screen, and/or any other suitable input and/or output device now known or hereafter developed. In some instances, external devices can also include portable computer readable (non-transitory) storage media such as database systems, thumb drives, portable optical or magnetic disks, and memory cards. In still some instances, external devices can be a mechanism to display data to a user, such as, for example, a computer monitor, a display screen, or the like.

In various embodiments, control logic 420 can include instructions that, when executed, cause processor(s) 402 to perform operations, which can include, but not be limited to, providing overall control operations of computing device; interacting with other entities, systems, etc. described herein; maintaining and/or interacting with stored data, information, parameters, etc. (e.g., memory element(s), storage, data structures, databases, tables, etc.); combinations thereof; and/or the like to facilitate various operations for embodiments described herein.

The programs described herein (e.g., control logic 420) may be identified based upon application(s) for which they are implemented in a specific embodiment. However, it should be appreciated that any particular program nomenclature herein is used merely for convenience; thus, embodiments herein should not be limited to use(s) solely described in any specific application(s) identified and/or implied by such nomenclature.

In various embodiments, entities as described herein may store data/information in any suitable volatile and/or non-volatile memory item (e.g., magnetic hard disk drive, solid state hard drive, semiconductor storage device, random access memory (RAM), read only memory (ROM), erasable programmable read only memory (EPROM), application specific integrated circuit (ASIC), etc.), software, logic (fixed logic, hardware logic, programmable logic, analog logic, digital logic), hardware, and/or in any other suitable component, device, element, and/or object as may be appropriate. Any of the memory items discussed herein should be construed as being encompassed within the broad term 'memory element'. Data/information being tracked and/or sent to one or more entities as discussed herein could be provided in any database, table, register, list, cache, storage, and/or storage structure: all of which can be referenced at any suitable timeframe. Any such storage options may also be included within the broad term 'memory element' as used herein.

Note that in certain example implementations, operations as set forth herein may be implemented by logic encoded in one or more tangible media that is capable of storing instructions and/or digital information and may be inclusive of non-transitory tangible media and/or non-transitory computer readable storage media (e.g., embedded logic provided in: an ASIC, digital signal processing (DSP) instructions, software [potentially inclusive of object code and source code], etc.) for execution by one or more processor(s), and/or other similar machine, etc. Generally, memory element(s) 404 and/or storage 406 can store data, software, code, instructions (e.g., processor instructions), logic, parameters, combinations thereof, and/or the like used for operations described herein. This includes memory element(s) 404 and/or storage 406 being able to store data, software, code, instructions (e.g., processor instructions), logic, parameters, combinations thereof, or the like that are executed to carry out operations in accordance with teachings of the present disclosure.

In some instances, software of the present embodiments may be available via a non-transitory computer useable medium (e.g., magnetic or optical mediums, magneto-optic mediums, CD-ROM, DVD, memory devices, etc.) of a stationary or portable program product apparatus, downloadable file(s), file wrapper(s), object(s), package(s), container(s), and/or the like. In some instances, non-transitory computer readable storage media may also be removable. For example, a removable hard drive may be used for memory/storage in some implementations. Other examples may include optical and magnetic disks, thumb drives, and smart cards that can be inserted and/or otherwise connected to a computing device for transfer onto another computer readable storage medium.

Variations and Implementations

Embodiments described herein may include one or more networks, which can represent a series of points and/or network elements of interconnected communication paths for receiving and/or transmitting messages (e.g., packets of information) that propagate through the one or more networks. These network elements offer communicative interfaces that facilitate communications between the network elements. A network can include any number of hardware and/or software elements coupled to (and in communication with) each other through a communication medium. Such networks can include, but are not limited to, any local area network (LAN), virtual LAN (VLAN), wide area network (WAN) (e.g., the Internet), software defined WAN (SD-WAN), wireless local area (WLA) access network, wireless wide area (WWA) access network, metropolitan area network (MAN), Intranet, Extranet, virtual private network (VPN), Low Power Network (LPN), Low Power Wide Area Network (LPWAN), Machine to Machine (M2M) network, Internet of Things (IoT) network, Ethernet network/switching system, any other appropriate architecture and/or system that facilitates communications in a network environment, and/or any suitable combination thereof.

Networks through which communications propagate can use any suitable technologies for communications including wireless communications (e.g., 4G/5G/nG, IEEE 802.11 (e.g., Wi-Fi®/Wi-Fi6®), IEEE 802.16 (e.g., Worldwide Interoperability for Microwave Access (WiMAX)), Radio-Frequency Identification (RFID), Near Field Communication (NFC), Bluetooth™, mm.wave, Ultra-Wideband (UWB), etc.), and/or wired communications (e.g., T1 lines, T3 lines, digital subscriber lines (DSL), Ethernet, Fibre Channel, etc.). Generally, any suitable means of communications may be used such as electric, sound, light, infrared, and/or radio to facilitate communications through one or more networks in accordance with embodiments herein. Communications, interactions, operations, etc. as discussed for various embodiments described herein may be performed among entities that may directly or indirectly connected utilizing any algorithms, communication protocols, interfaces, etc. (proprietary and/or non-proprietary) that allow for the exchange of data and/or information.

Communications in a network environment can be referred to herein as 'messages', 'messaging', 'signaling', 'data', 'content', 'objects', 'requests', 'queries', 'responses', 'replies', etc. which may be inclusive of packets. As referred to herein and in the claims, the term 'packet' may be used in a generic sense to include packets, frames, segments, datagrams, and/or any other generic units that may be used to transmit communications in a network environment. Generally, a packet is a formatted unit of data that can contain control or routing information (e.g., source and destination address, source and destination port, etc.) and data, which is also sometimes referred to as a 'payload', 'data payload', and variations thereof. In some embodiments, control or routing information, management information, or the like can be included in packet fields, such as within header(s) and/or trailer(s) of packets. Internet Protocol (IP) addresses discussed herein and in the claims can include any IP version 4 (IPv4) and/or IP version 6 (IPv6) addresses.

To the extent that embodiments presented herein relate to the storage of data, the embodiments may employ any number of any conventional or other databases, data stores or storage structures (e.g., files, databases, data structures, data or other repositories, etc.) to store information.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of can be represented using the' (s)' nomenclature (e.g., one or more element(s)).

In sum, a device is provided. The device may include an interface configured to enable network communications, a memory, and one or more processors coupled to the interface and the memory, and configured to: receive a message, process the message using forward error correction, in response to a predetermined condition, bypass at least some iterative calculations that are performed by the forward error correction, and output a processed message, wherein a latency resulting from processing the message using the forward error correction is proportional to a number of errors in the message.

In the device, the forward error correction may be performed with a Reed-Solomon forward error correction decoder.

The one or more processors may be configured to bypass the at least some iterative calculations of a key equation solver of the Reed-Solomon forward error correction decoder.

In the device, the at least some iterative calculations comprise calculations according to Euclid's method.

In the device, the predetermined condition may be that all coefficients of a syndrome polynomial of the message are zero.

In the device, when the message contains no errors, the one or more processors may be configured to bypass all iterative calculations that are performed by the forward error correction.

In the device, the predetermined condition may be that a degree of a value resulting from at least one iterative calculation that is performed by the forward error correction is lower than a maximum number of errors correctable by the forward error correction, and the one or more processors may be configured to prematurely terminate an iterative calculation process when the degree of the value is lower than a maximum number of errors correctable by the forward error correction.

A method is also provided. The method may include receiving a message, processing the message using forward error correction, in response to a predetermined condition, bypassing at least some iterative calculations that are performed by the forward error correction, and outputting a processed message.

The method may further include performing the forward error correction with a Reed-Solomon forward error correction decoder.

The method may further include bypassing the at least some iterative calculations of a key equation solver of the Reed-Solomon forward error correction decoder.

In the method, the at least some iterative calculations may include calculations according to Euclid's method.

In the method, the predetermined condition may be that all coefficients of a syndrome polynomial that is representative of the message are zero.

In the method, the message may contain no errors.

The method may further include bypassing all iterative calculations that are performed by the forward error correction.

In the method, the predetermined condition may be that a degree of a value resulting from at least one iterative calculation that is performed by the forward error correction is lower than a maximum number of errors correctable by the forward error correction.

The method may further include prematurely terminating an iterative loop of calculations when the degree of the value is lower than a maximum number of errors correctable by the forward error correction.

In the method, a latency resulting from processing the message using forward error correction may be proportional to a number of errors in the message.

In still another embodiment, one or more non-transitory computer readable storage media encoded with instructions are provided that, when executed by a processor, cause the processor to: receive a message, process the message using forward error correction, in response to a predetermined condition, bypass at least some iterative calculations that are performed by the forward error correction, and output a processed message.

The instructions may be configured to cause the processor to bypass all iterative calculations that are performed by the forward error correction when the predetermined condition is that all coefficients of a syndrome polynomial that is representative of the message are zero.

The instructions may be configured to cause the processor to prematurely terminate an iterative loop of calculations when the predetermined condition is that a degree of a value is lower than a maximum number of errors correctable by the forward error correction.

Each example embodiment disclosed herein has been included to present one or more different features. However, all disclosed example embodiments are designed to work together as part of a single larger system or method. This disclosure explicitly envisions compound embodiments that combine multiple previously discussed features in different example embodiments into a single system or method.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. A device comprising:
an interface configured to enable network communications;
a memory; and
one or more processors coupled to the interface and the memory, and configured to:
receive a message;
process the message using forward error correction;
in response to a predetermined condition that a degree of a value resulting from at least one iterative calculation that is performed by the forward error correction is lower than a maximum number of errors correctable by the forward error correction, prematurely terminate an iterative polynomial calculation process of the forward error correction; and
output a processed message,
wherein a latency resulting from processing the message using the forward error correction is proportional to a number of errors in the message.

2. The device of claim 1, wherein the forward error correction is performed with a Reed-Solomon forward error correction decoder.

3. The device of claim 2, wherein the one or more processors are configured to bypass at least some iterative calculations of a key equation solver of the Reed-Solomon forward error correction decoder.

4. The device of claim 3, wherein the at least some iterative calculations comprise calculations according to Euclid's method.

5. The device of claim 1, wherein the one or more processors are configured to receive another message and bypass operations of a key equation solver of the device in response to all coefficients of a syndrome polynomial of the another message being zero.

6. The device of claim 5, wherein the another message contains no errors, and the one or more processors are configured to bypass all iterative calculations that are to be performed by the forward error correction on the another message.

7. The device of claim 1, wherein the value is a residue polynomial.

8. A method comprising:
receiving a message;
processing the message using forward error correction;
in response to a predetermined condition that a degree of a value resulting from at least one iterative calculation that is performed by the forward error correction is lower than a maximum number of errors correctable by the forward error correction, prematurely terminating an iterative polynomial calculation process of the forward error correction; and
outputting a processed message.

9. The method of claim 8, further comprising performing the forward error correction with a Reed-Solomon forward error correction decoder.

10. The method of claim 9, further comprising bypassing at least some iterative calculations of a key equation solver of the Reed-Solomon forward error correction decoder.

11. The method of claim 10, wherein the at least some iterative calculations comprise calculations according to Euclid's method.

12. The method of claim 8, further comprising receiving another message and bypassing operations of a key equation solver of the forward error correction in response to all coefficients of a syndrome polynomial that is representative of the another message being zero.

13. The method of claim 12, wherein the another message contains no errors.

14. The method of claim 12, further comprising, for the another message, bypassing all iterative calculations that are performed by the forward error correction.

15. The method of claim 8, wherein the value is a residue polynomial.

16. The method of claim 8, wherein a latency resulting from processing the message using forward error correction is proportional to a number of errors in the message.

17. One or more non-transitory computer readable storage media encoded with instructions that, when executed by a processor, cause the processor to:
receive a message;
process the message using forward error correction;
in response to a predetermined condition that a degree of a value resulting from at least one iterative calculation that is performed by the forward error correction is lower than a maximum number of errors correctable by the forward error correction, prematurely terminate an iterative polynomial calculation process by the forward error correction; and
output a processed message.

18. The one or more non-transitory computer readable storage media of claim 17, wherein the instructions are configured to cause the processor to receive another message and bypass all iterative calculations that are performed by the forward error correction when all coefficients of a syndrome polynomial that is representative of the another message are zero.

19. The one or more non-transitory computer readable storage media of claim 17, wherein the forward error correction is performed with a Reed-Solomon forward error correction decoder.

20. The one or more non-transitory computer readable storage media of claim 17, wherein the value is a residue polynomial.

* * * * *